United States Patent
Jang et al.

(10) Patent No.: US 9,129,562 B2
(45) Date of Patent: Sep. 8, 2015

(54) EMISSION CONTROL LINE DRIVER AND ORGANIC LIGHT EMITTING DISPLAY USING THE SAME

(75) Inventors: Hwan-Soo Jang, Yongin (KR); Chang-Soo Pyon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 251 days.

(21) Appl. No.: 13/247,945

(22) Filed: Sep. 28, 2011

(65) Prior Publication Data

US 2012/0176417 A1 Jul. 12, 2012

(30) Foreign Application Priority Data

Jan. 6, 2011 (KR) .................. 10-2011-0001419

(51) Int. Cl.
*G09G 5/10* (2006.01)
*G09G 3/30* (2006.01)
*G09G 3/32* (2006.01)
*G11C 19/18* (2006.01)
*G11C 19/28* (2006.01)

(52) U.S. Cl.
CPC ............ *G09G 3/3266* (2013.01); *G11C 19/184* (2013.01); *G11C 19/28* (2013.01); *G09G 2300/0861* (2013.01); *G09G 2310/0262* (2013.01); *G09G 2310/0283* (2013.01); *G09G 2310/0286* (2013.01); *G09G 2330/025* (2013.01); *G09G 2330/027* (2013.01)

(58) Field of Classification Search
CPC ............ G09G 3/3266; G09G 2300/0861; G09G 2310/0262; G09G 2310/0283; G09G 2330/025; G09G 2330/027; G09G 2310/0286; G11C 19/28; G11C 19/184
See application file for complete search history.

(56) References Cited

U.S. PATENT DOCUMENTS

| | | | | |
|---|---|---|---|---|
| 2007/0063933 A1* | 3/2007 | Chung | ........................... | 345/76 |
| 2007/0240024 A1 | 10/2007 | Shin | | |
| 2007/0262935 A1 | 11/2007 | Shin | | |
| 2008/0079685 A1 | 4/2008 | Umezaki et al. | | |
| 2008/0150844 A1* | 6/2008 | Choi | ............................... | 345/76 |
| 2009/0225068 A1 | 9/2009 | Jeong et al. | | |

(Continued)

FOREIGN PATENT DOCUMENTS

| | | |
|---|---|---|
| CN | 101527110 | 9/2009 |
| JP | 2007-279667 | 10/2007 |

(Continued)

OTHER PUBLICATIONS

Extended European Search Report dated Apr. 5, 2012 for corresponding European Patent Application No. 11193980.7, 8pp.

(Continued)

*Primary Examiner* — Ryan A Lubit
*Assistant Examiner* — Yaron Cohen
(74) *Attorney, Agent, or Firm* — Christie, Parker & Hale, LLP

(57) ABSTRACT

An emission control line driver is capable of securing the stability of an output and of freely controlling the width of emission control signals. The emission control line driver includes a plurality of stages respectively coupled to emission control lines. Each of the stages includes a plurality of transistors that are configured to output the emission control signal. The width of the emission control signal may be controlled to correspond to the width of a start signal. Furthermore, a circuit structure of the stages is simplified.

26 Claims, 4 Drawing Sheets

(56) References Cited

U.S. PATENT DOCUMENTS

| | | |
|---|---|---|
| 2009/0303169 A1 | 12/2009 | Tanikame et al. |
| 2010/0188316 A1* | 7/2010 | Jang .............................. 345/76 |
| 2010/0207968 A1 | 8/2010 | Kim |

FOREIGN PATENT DOCUMENTS

| | | |
|---|---|---|
| JP | 2008-89915 A | 4/2008 |
| KR | 10-2010-0087870 A | 8/2010 |
| KR | 10-2010-0087871 A | 8/2010 |
| KR | 10-2010-0093738 | 8/2010 |
| TW | 200739499 | 10/2007 |
| TW | 201003605 | 1/2010 |

OTHER PUBLICATIONS

SIPO Office action dated Feb. 2, 2015, for corresponding Chinese Patent application 201110344357.8, (6 pages).

Taiwan Office Action dated Dec. 16, 2013 of the Taiwanese Patent Application 100149401 claiming priority of the corresponding Korean Patent Application No. 10-2011-0001419, (4 pages).

Japanese Office action mailed on Apr. 14, 2015, for corresponding Japanese Application No. 2011-124258; 4 pages.

* cited by examiner

EMISSION CONTROL LINE DRIVER AND ORGANIC LIGHT EMITTING DISPLAY USING THE SAME

CROSS-REFERENCE TO RELATED APPLICATION

This application claims priority to and the benefit of Korean Patent Application No. 10-2011-0001419, filed on Jan. 6, 2011, in the Korean Intellectual Property Office, the entire content of which is incorporated herein by reference.

BACKGROUND

1. Field

Aspects of embodiments according to the present invention relate to an emission control line driver and an organic light emitting display using the same.

2. Description of the Related Art

Recently, various flat panel displays (FPDs) with reduced weight and volume as compared to cathode ray tube (CRT) displays have been developed. The FPDs include a liquid crystal display (LCD), a field emission display (FED), a plasma display panel (PDP), and an organic light emitting display.

Among the FPDs, the organic light emitting display displays an image using organic light emitting diodes (OLEDs) that generate light by re-combination of electrons and holes. The organic light emitting display has a fast response speed and is driven with low power consumption. A typical organic light emitting display supplies current corresponding to data signals to the OLEDs by using transistors formed in pixels so that light is emitted by the OLEDs.

The typical organic light emitting display includes a data driver for supplying the data signals to data lines, a scan driver for sequentially supplying scan signals to scan lines, an emission control line driver for supplying emission control signals to emission control lines, and a display unit including a plurality of pixels coupled to the data lines, the scan lines, and the emission control lines.

The pixels included in the display unit are selected, when the scan signals are supplied to the scan lines, to receive the data signals from the data lines. The pixels that receive the data signals generate light with brightness (e.g., predetermined brightness) corresponding to the data signals and display a predetermined image. Here, the emission times of the pixels are controlled by the emission control signals that are supplied from the emission control lines. In general, the emission control signals are supplied to overlap the scan signals that are supplied to one scan line or two scan lines to set the pixels, to which the data signals are supplied, in a non-emission state.

Therefore, the emission control line driver includes stages coupled to the emission control lines. The stages receive at least four clock signals and output high or low voltages to output lines.

However, since the stages included in the typical emission control line driver are driven by at least four clock signals, a large number of transistors are included. Therefore, manufacturing cost increases and it is difficult to secure the reliability of driving. In addition, when the emission control line driver is formed of a PMOS transistor, a low level output is unstable.

To be specific, when a low signal is supplied to an emission control line, the gate electrode of the transistor that outputs the low signal is maintained at a lower voltage than the low signal. However, the voltage of the gate electrode of the transistor increases due to leakage current and the output of the low signal is unstable.

SUMMARY

Accordingly, embodiments of the present invention are directed toward an emission control line driver capable of securing the stability of an output and of freely controlling the width of emission control signals, and an organic light emitting display using the same.

According to an embodiment of the present invention, there is provided an emission control line driver including a plurality of stages. Each of the stages includes a first transistor coupled between a first output terminal and a first power source, the first transistor being configured to be turned on or off to correspond to a voltage applied to a first node that is coupled to a gate electrode of the first transistor, a second transistor coupled between the first output terminal and a second power source that outputs a voltage that is lower than the first power source, the second transistor being configured to be turned on or off to correspond to a voltage applied to a second node that is coupled to a gate electrode of the second transistor, a third transistor coupled between a fourth input terminal and the first node, and having a gate electrode coupled to a first input terminal, a fourth transistor coupled between the first power source and the second node, and having a gate electrode coupled to the first node, a first controller coupled to the first input terminal and a second input terminal to supply a sampling signal to a second output terminal, a second controller coupled to the first input terminal and a third input terminal to control the voltage of the second node, and a first capacitor coupled between the second input terminal and the second node.

The emission control line driver may further include a second capacitor coupled between the first node and the first power source. The first input terminal may be configured to receive a first clock signal. The second input terminal may be configured to receive a second clock signal. The third input terminal may be configured to receive a third clock signal. The fourth input terminal may be configured to receive a start signal or a sampling signal of a previous stage. The first clock signal, the second clock signal, and the third clock signal may not overlap each other. Each of the first clock signal and the second clock signal may be set in a period of i (i is a natural number) horizontal periods. The third clock signal may be set in a period of i/2 horizontal periods. The third clock signal may be supplied in a horizontal period after the first clock signal or the second clock signal is supplied in the horizontal period.

The first controller may include a fifth transistor coupled between the fourth input terminal and a third node, and having a gate electrode coupled to the first input terminal, a sixth transistor coupled between a sixth node and the second input terminal, and having a gate electrode coupled to the third node, a seventh transistor coupled between the sixth node and the first power source, and having a gate electrode coupled to the first output terminal, a third capacitor coupled between the third node and the sixth node, and a fourth capacitor coupled between the first output terminal and the first power source. The second output terminal may be electrically coupled to the sixth node.

The second controller may include an eighth transistor coupled between the first input terminal and a fourth node, and having a gate electrode coupled to the first node, a ninth transistor coupled between the fourth node and the second power source, and having a gate electrode coupled to the first input terminal, a tenth transistor coupled between the second node and a fifth node, and having a gate electrode coupled to the third input terminal, an eleventh transistor coupled between the fifth node and the third input terminal, and having a gate electrode coupled to the fourth node, and a fifth capacitor coupled between the fourth node and the fifth node.

The emission control line driver may further include a twelfth transistor coupled between the fourth input terminal and the third transistor, the twelfth transistor being configured to be turned on when a first control signal is supplied to a gate electrode of the twelfth transistor, and a thirteenth transistor coupled between a fifth input terminal and the first controller, the thirteenth transistor being configured to be turned on when a second control signal is supplied to a gate electrode of the thirteenth transistor. The first control signal and the second control signal may not overlap each other. The emission control line driver may further include a fourteenth transistor coupled between the first node and the second power source, the fourteenth transistor being configured to be turned on when a reset signal is supplied to a gate electrode of the fourteenth transistor. The reset signal may be commonly supplied to all of the stages.

According to an embodiment, an organic light emitting display includes a scan driver for sequentially supplying scan signals to scan lines, a data driver for supplying data signals to data lines, an emission control line driver for supplying emission control signals to emission control lines, and pixels positioned at crossing regions of the scan lines, the data lines, and the emission control lines. The emission control line driver includes stages respectively coupled to the emission control lines. Each of the stages includes a first transistor coupled between a first output terminal and a first power source, the first transistor being configured to be turned on or off to correspond to a voltage applied to a first node that is coupled to a gate electrode of the first transistor, a second transistor coupled between the first output terminal and a second power source that outputs a voltage that is lower than the first power source, the second transistor being configured to be turned on or off to correspond to a voltage applied to a second node that is coupled to a gate electrode of the second transistor, a third transistor coupled between a fourth input terminal and the first node, and having a gate electrode coupled to a first input terminal, a fourth transistor coupled between the first power source and the second node, and having a gate electrode coupled to the first node, a first controller coupled to the first input terminal and a second input terminal to supply a sampling signal to a second output terminal, a second controller coupled to the first input terminal and a third input terminal to control the voltage of the second node, and a first capacitor coupled between the second input terminal and the second node.

According to the emission control line driver illustrated in the embodiments of the present invention and the organic light emitting display using the same, the voltage of the gate electrode of the transistor that outputs the low signal is periodically reduced using the clock signal so that the stability of an output may be secured. In addition, according to the embodiments of the present invention, the width of the emission control signal may be controlled to correspond to the width of the start signal. Furthermore, according to the embodiments of the present invention, since the stages receive three clock signals, a circuit structure may be simplified.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
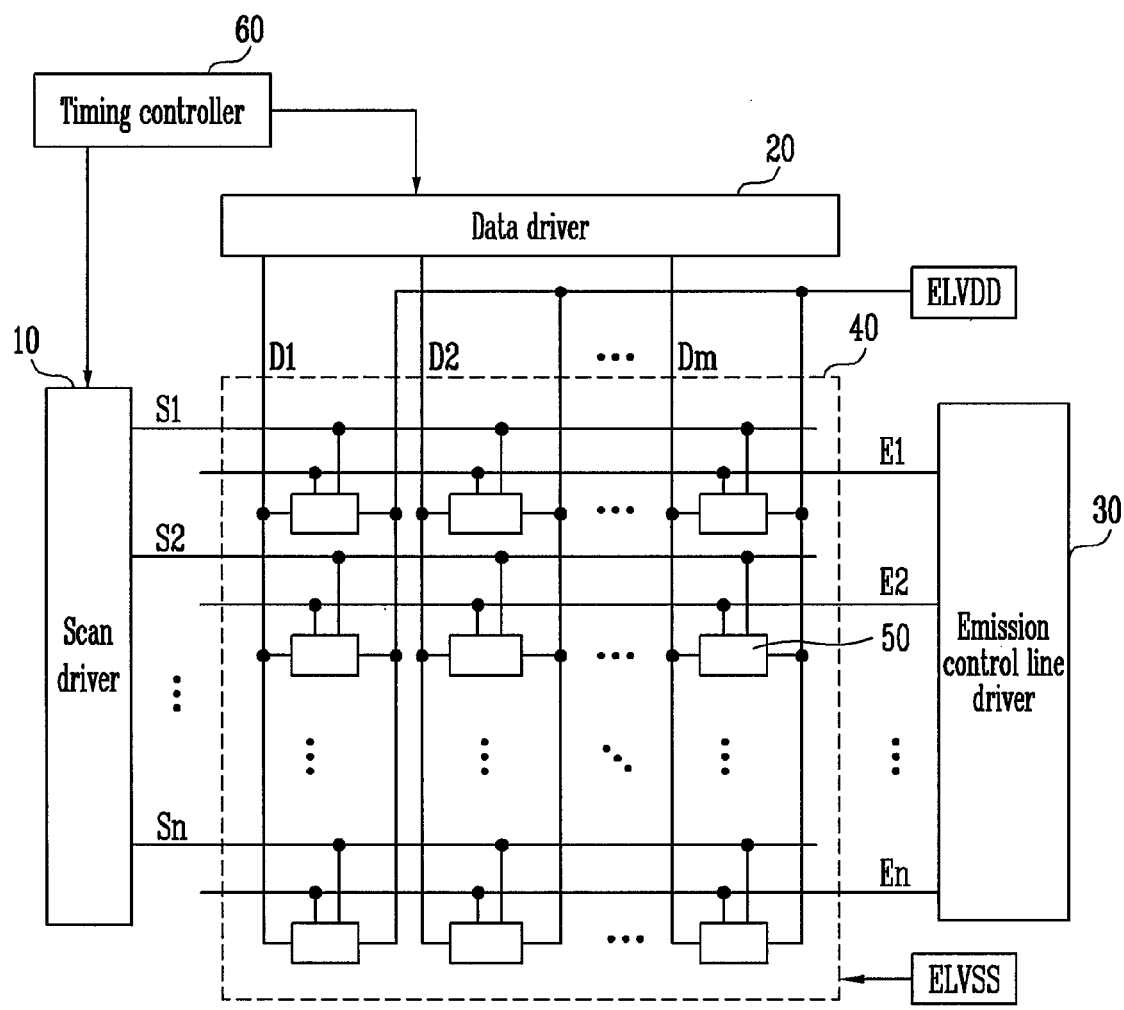
FIG. 1 is a block diagram illustrating an organic light emitting display according to an embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via one or more third elements. Further, some of the elements that are not essential to the complete understanding of the invention are omitted for clarity. Also, like reference numerals refer to like elements throughout.

Hereinafter, exemplary embodiments of the present invention, by which those skilled in the art may perform the present invention, will be described in detail with reference to FIGS. 1 to 6.

FIG. 1 is a block diagram illustrating an organic light emitting display according to an embodiment of the present invention.

Referring to FIG. 1, the organic light emitting display according to an embodiment of the present invention includes a display unit 40 that includes pixels 50 positioned at the crossing regions of scan lines S1 to Sn, data lines D1 to Dm, and emission control lines E1 to En, a scan driver 10 for driving the scan lines S1 to Sn, a data driver 20 for driving the data lines D1 to Dm, an emission control line driver 30 for driving the emission control lines E1 to En, and a timing controller 60 for controlling the drivers 10, 20, and 30.

The scan driver 10 sequentially supplies scan signals to the scan lines S1 to Sn. When the scan signals are supplied to the scan lines S1 to Sn, the pixels 50 are selected in units of horizontal lines (e.g., line-by-line).

The data driver 20 supplies data signals to the data lines D1 to Dm in synchronization with the scan signals. The data signals supplied to the data lines D1 to Dm are supplied to the pixels 50 that are selected by the scan signals.

The emission control line driver 30 sequentially supplies emission control signals to the emission control lines E1 to En. Here, the emission control line driver 30 supplies the emission control signals so that the pixels 50 are set in a non-emission state during a period when the voltages corresponding to the data signals are charged. Therefore, the emission control signal supplied to the $i^{th}$ (i is a natural number) emission control line $E_i$ overlaps the scan signal supplied to the $i^{th}$ scan line $S_i$. On the other hand, the width of the emission control signal may be suitably set to correspond to the structure of the pixel 50 and the brightness to be realized.

Figure 2:
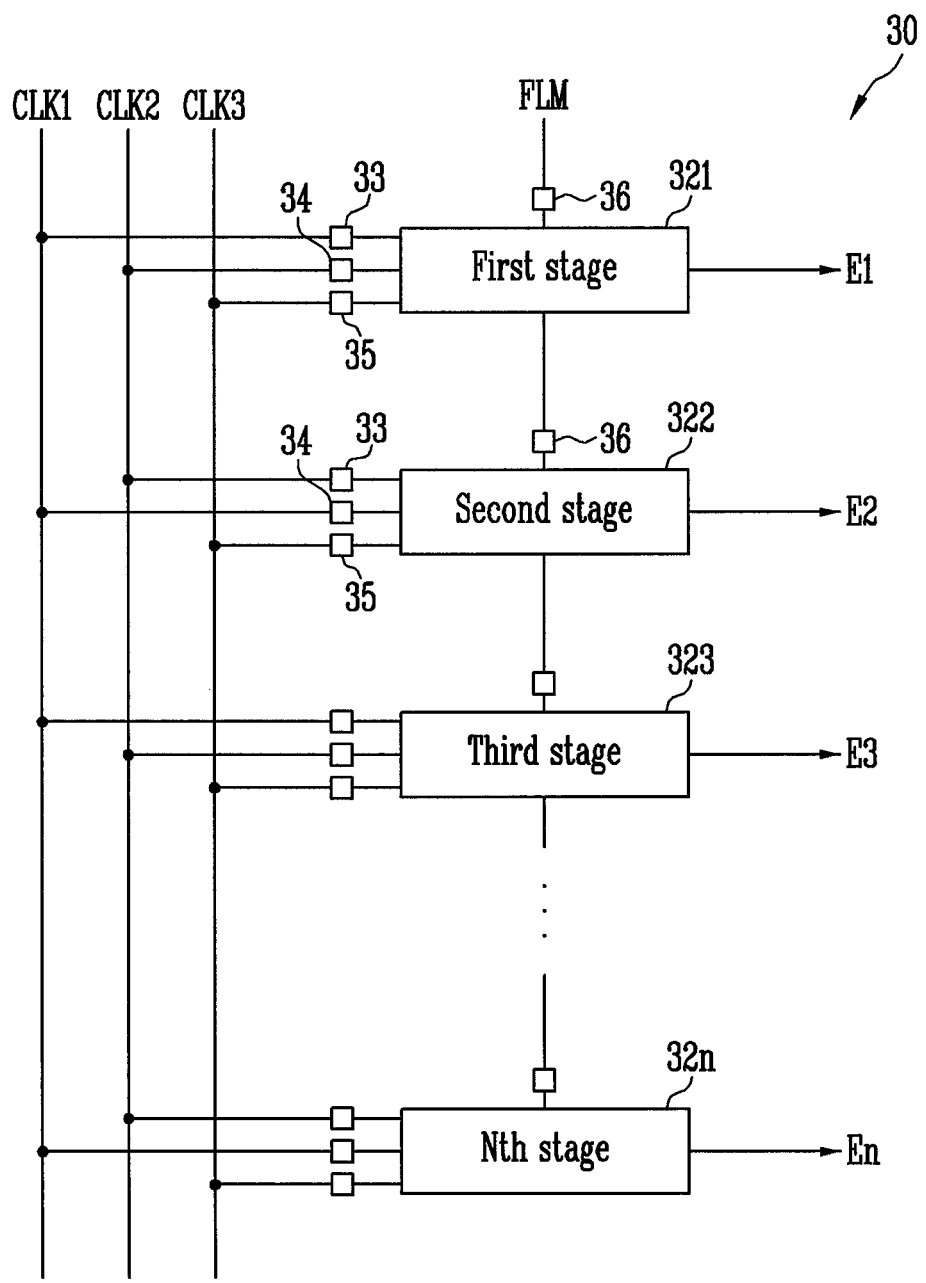
FIG. 2 is a block diagram schematically illustrating stages of an emission control line driver of FIG. 1.

FIG. 2 is a block diagram schematically illustrating stages of the emission control line driver of FIG. 1.

Referring to FIG. 2, the emission control line driver 30 according to an embodiment of the present invention includes n stages 321 to 32n in order to supply emission control signals to the n emission control lines E1 to En. The stages 321 to 32n are coupled to the emission control lines E1 to En, respectively, and are driven by three clock signals CLK1, CLK2, and CLK3.

Each of the stages 321 to 32n includes a first input terminal 33, a second input terminal 34, a third input terminal 35, and a fourth input terminal 36.

The first input terminal 33 of a $k^{th}$ (k is an odd or even number) stage 32k receives the first clock signal CLK1 and the second input terminal 34 receives the second clock signal CLK2. The first input terminal 33 of a $(k+1)^{th}$ stage 32k+1 receives the second clock signal CLK2, and the second input terminal 34 receives the first clock signal CLK1. The third clock signal CLK3 is supplied to the third input terminal 35 of each of the stages 321 to 32n, and a start signal FLM or a sampling signal of a previous stage is supplied to the fourth input terminal 36.

The stages 321 to 32n may be formed of the same circuit and generate the emission control signals having width that is changed to correspond to the start signal FLM.

Figure 3:
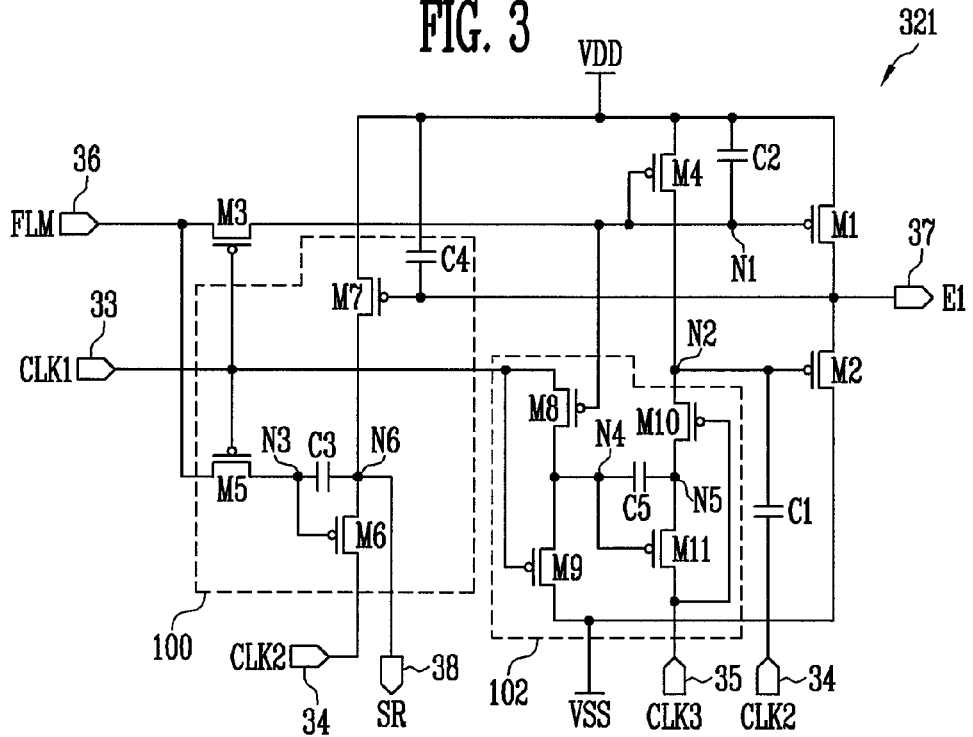
FIG. 3 is a circuit diagram illustrating a first embodiment of one of the stages of FIG. 2.

FIG. 3 is a circuit diagram illustrating a first embodiment of one of the stages of FIG. 2. In FIG. 3, for convenience sake, the first stage 321 will be illustrated.

Referring to FIG. 3, the stage 321, according to the first embodiment of the present invention, includes a first transistor M1, a second transistor M2, a third transistor M3, a fourth transistor M4, a first capacitor C1, a second capacitor C2, a first controller 100, and a second controller 102.

The first transistor M1 is coupled between a first output terminal 37 and a first power source VDD. The gate electrode of the first transistor M1 is coupled to a first node N1. The first transistor M1 controls the voltage of the first output terminal 37 to correspond to the voltage applied to the first node N1. Here, when the first transistor M1 is turned on, the first power source VDD (e.g., a high voltage) is supplied to the first output terminal 37. Since the first output terminal 37 is coupled to the emission control line E1, the high voltage supplied to the first output terminal 37 is used as an emission control signal.

The second transistor M2 is coupled between the first output terminal 37 and a second power source VSS. The gate electrode of the second transistor M2 is coupled to a second node N2. The second transistor M2 controls the voltage of the first output terminal 37 to correspond to the voltage applied to the second node N2. Here, when the second transistor M2 is turned on, the second power source VSS (e.g., a low voltage) is supplied to the first output terminal 37.

The third transistor M3 is coupled between the fourth input terminal 36 and the first node N1. The gate electrode of the third transistor M3 is coupled to the first input terminal 33. The third transistor M3 is turned on or off to correspond to the first clock signal CLK1 supplied to the first input terminal 33. When the third transistor M3 is turned on, the fourth input terminal 36 and the first node N1 are electrically coupled to each other. When the start signal FLM (or a previous stage sampling signal) is supplied to the fourth input terminal 36, the first transistor M1 is turned on.

The fourth transistor M4 is coupled between the first power source VDD and the second node N2. The gate electrode of the fourth transistor M4 is coupled to the first node N1. The fourth transistor M4 is turned on or off to correspond to the voltage that is applied to the first node N1 in order to control the voltage of the second node N2. That is, the fourth transistor M4 is turned on when a low voltage is applied to the first node N1 in order to supply the voltage of the first power source VDD to the second node N2. When the low voltage is supplied to the first node N1, the high voltage of the first power source VDD is supplied to the second node N2 so that the first transistor M1 and the second transistor M2 are turned on or off at different times.

The first capacitor C1 is coupled between the second input terminal 34 and the second node N2. The first capacitor C1 controls the voltage of the second node N2 to correspond to the second clock signal CLK2 supplied to the second input terminal 34. The operation processes of the first capacitor C1 will be described later in more detail.

The second capacitor C2 is coupled between the first node N1 and the first power source VDD. The second capacitor C2 is charged with the voltage corresponding to the turning on or off of the first transistor M1.

A first controller 100 supplies a sampling signal to a second output terminal 38 to correspond to the first clock signal CLK1 and the second clock signal CLK2. Therefore, the first controller 100 includes a fifth transistor M5, a sixth transistor M6, a seventh transistor M7, a third capacitor C3, and a fourth capacitor C4.

The fifth transistor M5 is coupled between the fourth input terminal 36 and a third node N3. The gate electrode of the fifth transistor M5 is coupled to the first input terminal 33. The fifth transistor M5 is turned on or off to correspond to the first clock signal CLK1 supplied to the first input terminal 33 in order to control the voltage of the third node N3.

The sixth transistor M6 is coupled between a sixth node N6 and the second input terminal 34. The gate electrode of the sixth transistor M6 is coupled to the third node N3. The sixth transistor M6 controls the voltage of the sixth node N6 to correspond to the voltage applied to the third node N3.

The seventh transistor M7 is coupled between the first power source VDD and the sixth node N6. The gate electrode of the seventh transistor M7 is coupled to the first output terminal 37. The seventh transistor M7 is turned on or off to correspond to the voltage applied to the first output terminal 37 in order to control the voltage of the sixth node N6.

The third capacitor C3 is coupled between the third node N3 and the sixth node N6. The third capacitor C3 is charged with the voltage corresponding to the turning on or turning off of the sixth transistor M6.

The fourth capacitor C4 is coupled between the first power source VDD and the first output terminal 37. The fourth capacitor C4 is charged with the voltage corresponding to the turning on or off of the seventh transistor M7.

In FIG. 3, the second output terminal 38 is coupled to the sixth node N6. The second output terminal 38 supplies the voltage applied to the sixth node N6 as a sampling signal to a next stage 322.

The second controller 102 controls the voltage of the second node N2 to correspond to the first clock signal CLK1 and the third clock signal CLK3. Here, in a period when the emission control signal is not supplied to the first output terminal 37, the second controller 102 maintains the voltage of the second node N2 as a low voltage. In FIG. 3, the second controller 102 includes an eighth transistor M8, a ninth transistor M9, a tenth transistor M10, an eleventh transistor M11, and a fifth capacitor C5.

The eighth transistor M8 is coupled between the first input terminal 33 and a fourth node N4. The gate electrode of the eighth transistor M8 is coupled to the first node N1. The eighth transistor M8 is turned on or off to correspond to the voltage applied to the first node N1 in order to control the voltage of the fourth node N4.

The ninth transistor M9 is coupled between the fourth node N4 and the second power source VSS. The gate electrode of the ninth transistor M9 is coupled to the first input terminal 33. The ninth transistor M9 is turned on or off to correspond to the first clock signal CLK1 supplied to the first input terminal 33 in order to control the voltage of the fourth node N4.

The tenth transistor M10 is coupled between the second node N2 and a fifth node N5. The gate electrode of the tenth transistor M10 is coupled to a third input terminal 35. The tenth transistor M10 is turned on or off to correspond to the third clock signal CLK3 supplied to the third input terminal 35 in order to control the voltage of the second node N2.

The eleventh transistor M11 is coupled between the fifth node N5 and the third input terminal 35. The gate electrode of the eleventh transistor M11 is coupled to the fourth node N4. The eleventh transistor M11 is turned on or off to correspond to the voltage applied to the fourth node N4 in order to control the voltage of the fifth node N5.

The fifth capacitor C5 is coupled between the fourth node N4 and the fifth node N5. The fifth capacitor C5 is charged with the voltage corresponding to the turning on or off of the eleventh transistor M11.

Figure 4:
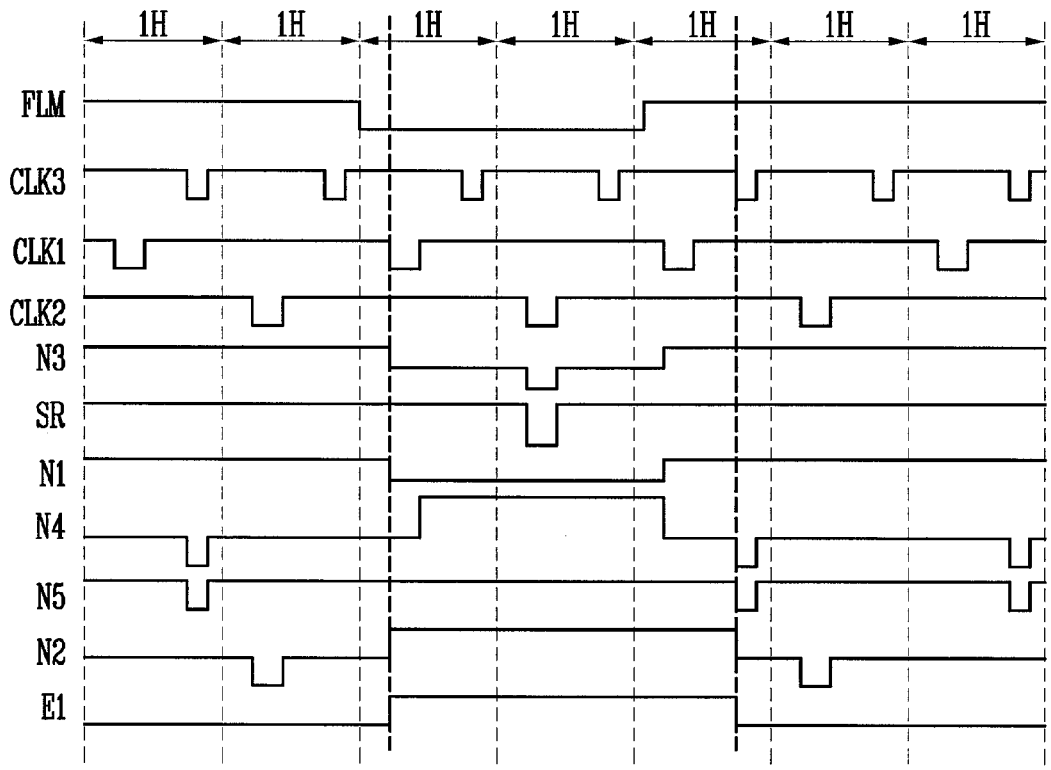
FIG. 4 is a waveform chart illustrating the operation processes of one of the stages of FIG. 3.

FIG. 4 is a waveform chart illustrating the operation processes of the stage of FIG. 3.

Referring to FIG. 4, the first clock signal CLK1 and the second clock signal CLK2 are supplied in the period of iH (i is a natural number, e.g., a horizontal period), and the third clock signal CLK3 is supplied in the period of i/2H. In FIG. 4, for convenience sake, the first clock signal CLK1 and the second clock signal CLK2 are set in the period of 2H and the third clock signal CLK3 is set in the period of 1H.

In FIG. 4, the first clock signal CLK1 and the second clock signal CLK2 are supplied in different horizontal periods H, and the third clock signal CLK3 is supplied every horizontal period H so that the first clock signal CLK1 does not overlap the third clock signal CLK3. Then, in the horizontal period H, after the first clock signal CLK1 or the second clock signal CLK2 is supplied, the third clock signal CLK3 is supplied. That is, in an exemplary horizontal period, the third clock signal CLK3 is supplied after the first clock signal CLK1 is supplied. In the next horizontal period, the third clock signal CLK3 is supplied after the second clock signal CLK2 is supplied.

Operation processes will be described in more detail as follows. First, the start signal FLM (e.g., the low signal) is supplied to the fourth input terminal 36. After the start signal FLM is supplied to the fourth input terminal 36, the first clock signal CLK1 is supplied to the first input terminal 33. When the first clock signal CLK1 is supplied, the third transistor M3, the fifth transistor M5, and the ninth transistor M9 are turned on.

When the third transistor M3 is turned on, the start signal FLM is supplied to the first node N1. When the start signal FLM is supplied to the first node N1, the first transistor M1, the fourth transistor M4, and the eighth transistor M8 are turned on.

When the first transistor M1 is turned on, the voltage corresponding to the turning on of the first transistor M1 is charged at the second capacitor C2. When the first transistor M1 is turned on, the voltage of the first power source VDD is supplied to the first output terminal 37. In this case, the emission control signal is supplied to the emission control line E1.

When the fourth transistor M4 is turned on, the first power source VDD is supplied to the second node N2. When the first power source VDD is supplied to the second node N2, the second transistor M2 is turned off. When the second transistor M2 is turned off, the first power source VDD may be stably supplied to the first output terminal 37.

When the eighth transistor M8 is turned on, the fourth node N4 and the first input terminal 33 are electrically coupled to each other. Here, since the first clock signal CLK1 is supplied to the first input terminal 33, the fourth node N4 receives a low voltage.

When the fifth transistor M5 is turned on, the start signal is supplied to the third node N3. When the start signal is supplied to the third node N3, the sixth transistor M6 is turned on. When the sixth transistor M6 is turned on, the sixth node N6 and the second input terminal 34 are electrically coupled to each other. Here, since the second clock signal CLK2 is not supplied to the second input terminal 34, the sixth node N6 maintains a high voltage so that a sampling signal is not supplied to the second output terminal 38. On the other hand, since the sixth transistor M6 is turned on, the voltage corresponding to the turning on of the sixth transistor M6 is charged at the third capacitor C3.

When the ninth transistor M9 is turned on, the voltage of the second power source VSS is supplied to the fourth node N4. When the second power source VSS is supplied to the fourth node N4, the eleventh transistor M11 is turned on. When the eleventh transistor M11 is turned on, the fifth node N5 and the third input terminal 35 are electrically coupled to each other. Here, since the third clock signal CLK3 is not supplied to the third input terminal 35, the fifth node N5 maintains a high voltage. On the other hand, since the eleventh transistor M11 is turned on, the voltage corresponding to the turning on of the eleventh transistor is charged at the fifth capacitor C5.

Then, the supply of the first clock signal CLK1 to the first input terminal 33 is stopped. When the supply of the first clock signal CLK1 is stopped, the third transistor M3, the fifth transistor M5, and the ninth transistor M9 are turned off.

When the third transistor M3 is turned off, the fourth input terminal 36 and the first node N1 are electrically isolated from each other. Here, the first node N1 maintains a low voltage by the second capacitor C2. Therefore, the first transistor M1 maintains a turn on state so that the voltage of the first power source VDD is output to the first output terminal 37. Since the fourth transistor M4 maintains a turn on state by the voltage of the second capacitor C2, the second transistor M2 stably maintains a turn off state.

When the fifth transistor M5 is turned off, the fourth input terminal 36 and the third node N3 are electrically isolated from each other. Here, the sixth transistor M6 maintains a turn on state to correspond to the voltage charged at the third capacitor C3 so that the second output terminal 38 maintains a previous voltage.

When the ninth transistor M9 is turned off, the fourth node N4 and the second power source VSS are electrically isolated from each other. Here, since the eighth transistor M8 maintains a turned on state to correspond to the voltage applied to the first node N1, the fourth node N4 and the first input terminal 33 are electrically coupled to each other. Therefore, the voltage of the fourth node N4 increases to the voltage supplied to the first input terminal 33 (e.g., the voltage of a high signal). When the fourth node N4 receives the voltage of the high signal, the eleventh transistor M11 is turned off. Here, the fifth capacitor C5 is charged with the voltage corresponding to the turning off of the eleventh transistor M11.

Then, the third clock signal CLK3 is supplied to the third input terminal 35. When the third clock signal CLK3 is supplied, the tenth transistor M10 is turned on. When the tenth transistor M10 is turned on, the second node N2 and the fifth node N5 are electrically coupled to each other. At this time, since the fourth transistor M4 maintains a turned on state and the eleventh transistor M11 maintains a turned off state, the second node N2 maintains the voltage of the first power source VDD.

After the third clock signal CLK3 is supplied, the second clock signal CLK2 is supplied to the second input terminal 34 in the next horizontal period. Here, since the sixth transistor M6 is set in a turn on state, the second clock signal CLK2 is supplied to the sixth node N6. The second clock signal CLK2 supplied to the sixth node N6 as a sampling signal is supplied to the next stage via the second output terminal 38. On the other hand, when the second clock signal CLK2 is supplied to the sixth node N6, the voltage of the third node N3 is reduced by the coupling of the third capacitor C3. Therefore, the sixth transistor M6 stably maintains a turned on state.

Additionally, the second clock signal CLK2 supplied to the second input terminal 34 is transmitted to the second node N2 by the coupling of the first capacitor C1. Here, since the second node N2 receives the first power source VDD, the voltage of the first power source VDD is maintained without a change in a voltage.

Then, the third clock signal CLK3 is supplied to the third input terminal 35. When the third clock signal CLK3 is supplied, the tenth transistor M10 is turned on. When the tenth transistor M10 is turned on, the second node N2 and the fifth node N5 are electrically coupled to each other. Here, since the fourth transistor M4 maintains a turned on state and the eleventh transistor M11 maintains a turned off state, the second node N2 maintains the voltage of the first power source VDD.

After the third clock signal CLK3 is supplied, the supply of the start signal FLM is stopped (e.g., a high voltage) in the next horizontal period, and the first clock signal CLK1 is supplied to the first input terminal 33.

When the first clock signal CLK1 is supplied, the third transistor M3, the fifth transistor M5, and the ninth transistor M9 are turned on.

When the third transistor M3 is turned on, the first node N1 and the fourth input terminal 36 are electrically coupled to each other. Here, since a high voltage is supplied to the first node N1, the first transistor M1, the fourth transistor M4, and the eighth transistor M8 are turned off. When the first transistor M1 is turned off, the first output terminal 37 is set in a floating state. In this case, the first output terminal 37 maintains the high voltage that is an output signal of a previous period.

Since the emission control signal supplied to the emission control line E1 is supplied to the pixels 50, charging is performed by the capacitors of the pixels. Therefore, although the first output terminal 37 is set in a floating state, the output voltage of a previous period is maintained by the parasitic capacitors of the pixels 50 and the emission control line.

When the fifth transistor M5 is turned on, a high voltage is supplied to the third node N3 so that the sixth transistor M6 is turned off. When the sixth transistor M6 is turned off, the sixth node N6 and the second input terminal 34 are electrically isolated from each other. Here, the third capacitor C3 is charged with the voltage corresponding to the turning off of the sixth transistor M6.

When the ninth transistor M9 is turned on, the fourth node N4 and the second power source VSS are electrically coupled to each other. Here, the fourth node N4 receives the voltage of the second power source VSS so that the eleventh transistor M11 is turned on. When the eleventh transistor M1 is turned on, the fifth node N5 and the third input terminal 35 are electrically coupled to each other. On the other hand, the voltage corresponding to the turning on of the eleventh transistor M11 is stored at the fifth capacitor C5.

Then, the third clock signal CLK3 is supplied to the third input terminal 35. When the third clock signal CLK3 is supplied, the tenth transistor M10 is turned on. When the tenth transistor M10 is turned on, the second node N2 and the third input terminal 35 are electrically coupled to each other via the fifth node N5. Here, the third clock signal CLK3 (e.g., a low voltage) is supplied to the second node N2. When the low voltage is supplied to the second node N2, the second transistor M2 is turned on so that the voltage of the second power source VSS is output to the first output terminal 37. In this case, the supply of the emission control signal to the emission control line E1 is stopped. When the second power source VSS is supplied to the first output terminal 37, the seventh transistor M7 is turned on. When the seventh transistor M7 is turned on, the voltage of the first power source VDD is supplied to the sixth node N6.

According to an embodiment of the present invention, the third clock signal CLK3 may be set as a voltage lower than the second power source VSS so that the second transistor M2 may be stably turned on. Then, the stage 321 outputs the voltage of the first power source VDD to the first output terminal 37 until the next start signal FLM is supplied.

Additionally, according to embodiments of the present invention, whenever the second clock signal CLK2 is supplied, the voltage of the second node N2 is reduced by the coupling of the first capacitor C1. Therefore, the voltage of the second node N2 stably maintains a low voltage so that the voltage of the second power source VSS may be stably output to the first output terminal 37.

On the other hand, a sampling signal is supplied to the next stage in synchronization with the second clock signal CLK2 (In the next stage, the second clock signal CLK2 is supplied to the first input terminal). In this case, the next stage stably outputs the emission control signal using the sampling signal.

Additionally, in FIG. 4, it is illustrated that one sampling signal is generated to correspond to the start signal FLM. However, the present invention is not limited to the above. For example, when the start signal FLM overlaps two first clock signals CLK1, two sampling signals are supplied to the next stage. Therefore, according to embodiments of the present invention, the width of the start signal FLM is controlled so that the width of the emission control signal may be freely controlled.

Figure 5:
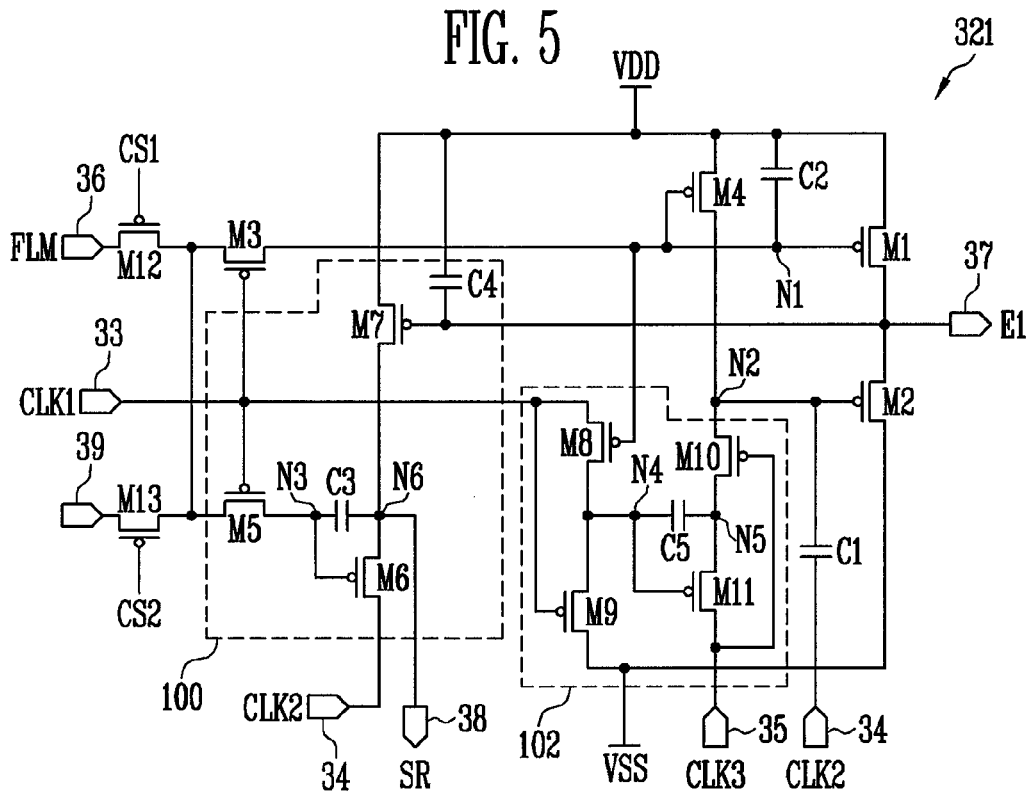
FIG. 5 is a circuit diagram illustrating a second embodiment of one of the stages of FIG. 2.

FIG. 5 is a circuit diagram illustrating a second embodiment of the stage of FIG. 2. In FIG. 5, the same elements as those of FIG. 3 are denoted by the same reference numerals and detailed description thereof will be omitted.

Referring to FIG. 5, the stage 321, according to the second embodiment of the present invention, further includes a twelfth transistor M12 and a thirteenth transistor M13 for bidirectional driving.

The twelfth transistor M12 is coupled between the fourth input terminal 36 and the third transistor M3. The gate electrode of the twelfth transistor M12 receives a first control signal CS1. The twelfth transistor M12 is turned on when the first control signal CS1 is supplied.

The thirteenth transistor M13 is coupled between a fifth input terminal 39 and the fifth transistor M5 (or a first controller 100). Then, the gate electrode of the thirteenth transistor M13 receives a second control signal CS2. The thirteenth transistor M13 is turned on when the second control signal CS2 is supplied. The fifth input terminal 39 receives the start signal or the sampling signal of the next stage.

Here, the first control signal CS1 and the second control signal CS2 are supplied at different times (e.g., not overlapped with each other). For example, when the emission control signals are supplied in a first direction (from top to bottom of a panel), the first control signal CS1 is supplied so that the twelfth transistor M12 is turned on and so that the thirteenth transistor M13 maintains a turned off state. When the emission control signals are supplied in a second direction (from bottom to top of the panel), the second control signal CS2 is supplied so that the thirteenth transistor M13 is turned on and so that the twelfth transistor M12 maintains a turned off state.

The stage 321, according to the second embodiment of the present invention, further includes the twelfth transistor M12 and the thirteenth transistor M13 for bidirectional driving, and the operation processes are substantially the same as the first embodiment illustrated in FIG. 3.

Figure 6:
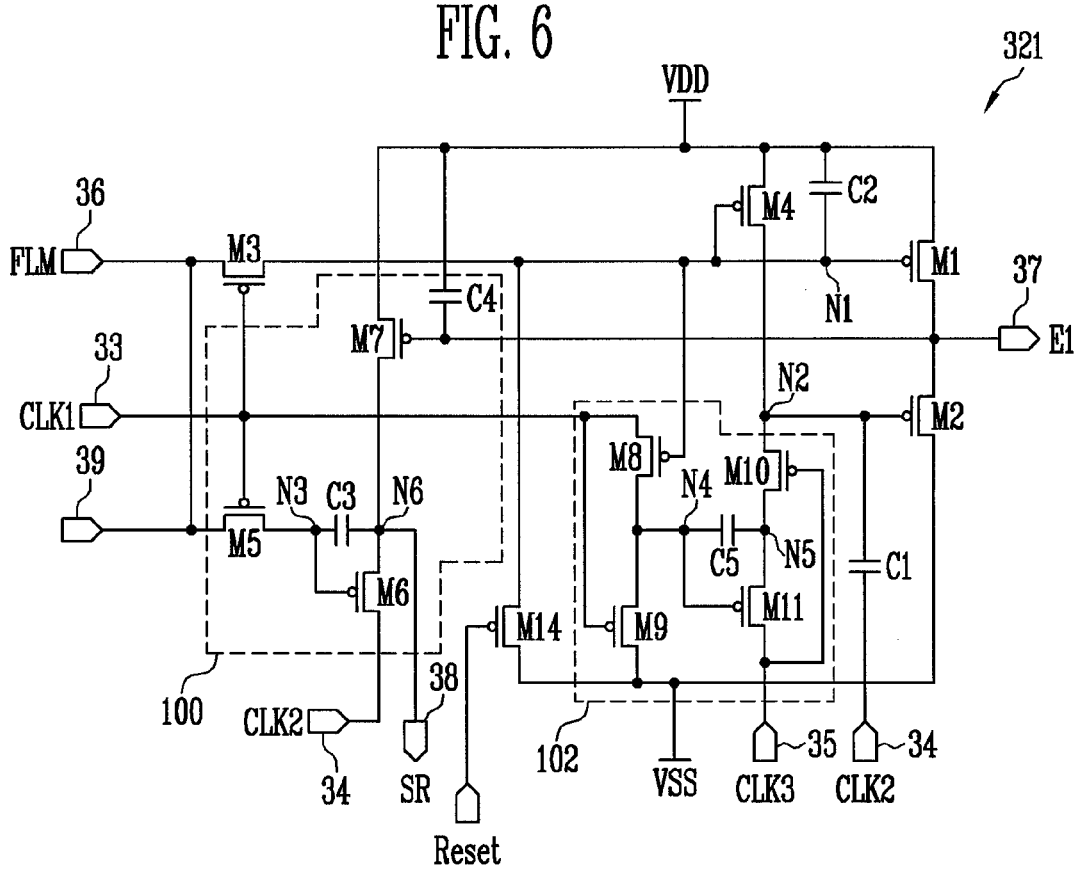
FIG. 6 is a circuit diagram illustrating a third embodiment of one of the stages of FIG. 2.

FIG. 6 is a circuit diagram illustrating a third embodiment of the stage of FIG. 2. In FIG. 6, the same elements as those of FIG. 3 are denoted by the same reference numerals, and detailed description thereof will be omitted.

Referring to FIG. 6, the stage 321, according to the third embodiment of the present invention, further includes a fourteenth transistor M14 coupled between the first node N1 and the second power source VSS. The fourteenth transistor M14 is turned on to supply the voltage of the second power source VSS to the first node N1 when a reset signal (Reset) is supplied to the gate of the fourteenth transistor M14. When the second power source VSS is supplied to the first node N1, the first transistor M1 is turned on so that the voltage of the first power source VDD is supplied to the first output terminal 37.

Here, the reset signal (Reset) is commonly supplied to all of the stages 321 to 32n when a power source is turned on and/or off. As described above, when the reset signal (Reset) is supplied and the power source is turned on and/or off, the emission control signals are supplied to the emission control lines E1 to En so that the pixels 50 are set in a non-emission state. That is, according to the third embodiment of the present invention, it is possible to prevent over-current from flowing or unnecessary light from being generated when the power source is turned on and/or off using the reset signal.

Additionally, in FIG. 2, the third clock signal CLK3 is supplied to all of the stages 321 to 32n. However, the present invention is not limited to the above. For example, the third clock signal CLK3 may be supplied to even and odd stages via different lines. Then, the load of the third clock signal CLK3 is minimized or reduced so that the stability of driving the stages may be improved.

The present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An emission control line driver comprising a plurality of stages, wherein each of the stages comprises:
    a first transistor electrically coupled between a first output terminal and a first power source, the first transistor being configured to be turned on or off to correspond to a voltage applied to a first node that is directly coupled to a gate electrode of the first transistor;
    a second transistor electrically coupled between the first output terminal and a second power source that outputs a voltage that is lower than the first power source, the second transistor being configured to be turned on or off to correspond to a voltage applied to a second node that is directly coupled to a gate electrode of the second transistor;
    a third transistor coupled between a fourth input terminal and the first node, and having a gate electrode directly coupled to a first input terminal, the third transistor being configured to electrically couple the first node to the fourth input terminal in response to a signal received from the first input terminal;
    a fourth transistor coupled between the first power source and the second node, and having a gate electrode directly coupled to the first node;
    a first controller coupled to the first input terminal and a second input terminal and configured to supply a sampling signal to a second output terminal;
    a second controller electrically coupled to the first input terminal and a third input terminal and configured to control the voltage of the second node; and
    a first capacitor electrically coupled between the second input terminal and the second node.

2. The emission control line driver as claimed in claim 1, further comprising a second capacitor coupled between the first node and the first power source.

3. The emission control line driver as claimed in claim 1,
    wherein the first input terminal is configured to receive a first clock signal,
    wherein the second input terminal is configured to receive a second clock signal,
    wherein the third input terminal is configured to receive a third clock signal, and
    wherein the fourth input terminal is configured to receive a start signal or a sampling signal of a previous stage.

4. The emission control line driver as claimed in claim 3, wherein the first clock signal, the second clock signal, and the third clock signal do not overlap each other.

5. The emission control line driver as claimed in claim 3,
    wherein each of the first clock signal and the second clock signal are set in a period of i horizontal periods, and
    wherein the third clock signal is set in a period of i/2 horizontal periods.

6. The emission control line driver as claimed in claim 5, wherein the third clock signal is supplied in a horizontal period after the first clock signal or the second clock signal is supplied in the horizontal period.

7. The emission control line driver as claimed in claim 1, wherein the first controller comprises:
    a fifth transistor coupled between the fourth input terminal and a third node, and having a gate electrode coupled to the first input terminal;
    a sixth transistor coupled between a sixth node and the second input terminal, and having a gate electrode coupled to the third node;
    a seventh transistor coupled between the sixth node and the first power source, and having a gate electrode coupled to the first output terminal;
    a third capacitor coupled between the third node and the sixth node; and
    a fourth capacitor coupled between the first output terminal and the first power source.

8. The emission control line driver as claimed in claim 7, wherein the second output terminal is electrically coupled to the sixth node.

9. The emission control line driver as claimed in claim 1, wherein the second controller comprises:
    an eighth transistor coupled between the first input terminal and a fourth node, and having a gate electrode coupled to the first node;
    a ninth transistor coupled between the fourth node and the second power source, and having a gate electrode coupled to the first input terminal;

a tenth transistor coupled between the second node and a fifth node, and having a gate electrode coupled to the third input terminal;

an eleventh transistor coupled between the fifth node and the third input terminal, and having a gate electrode coupled to the fourth node; and a fifth capacitor coupled between the fourth node and the fifth node.

10. The emission control line driver as claimed in claim 1, further comprising:

a twelfth transistor coupled between the fourth input terminal and the third transistor, the twelfth transistor being configured to be turned on when a first control signal is supplied to a gate electrode of the twelfth transistor; and a thirteenth transistor coupled between a fifth input terminal and the first controller, the thirteenth transistor being configured to be turned on when a second control signal is supplied to a gate electrode of the thirteenth transistor.

11. The emission control line driver as claimed in claim 10, wherein the first control signal and the second control signal do not overlap each other.

12. The emission control line driver as claimed in claim 10, wherein the fifth input terminal is configured to receive a start signal or a sampling signal of a next stage.

13. The emission control line driver as claimed in claim 1, further comprising a fourteenth transistor coupled between the first node and the second power source, the fourteenth transistor being configured to be turned on when a reset signal is supplied to a gate electrode of the fourteenth transistor.

14. The emission control line driver as claimed in claim 13, wherein the reset signal is commonly supplied to all of the stages.

15. An organic light emitting display comprising:

a scan driver for sequentially supplying scan signals to scan lines;

a data driver for supplying data signals to data lines;

an emission control line driver for supplying emission control signals to emission control lines; and pixels positioned at crossing regions of the scan lines, the data lines, and the emission control lines, wherein the emission control line driver comprises stages respectively coupled to the emission control lines, and wherein each of the stages comprises:

a first transistor electrically coupled between a first output terminal and a first power source, the first transistor being configured to be turned on or off to correspond to a voltage applied to a first node that is directly coupled to a gate electrode of the first transistor;

a second transistor electrically coupled between the first output terminal and a second power source that outputs a voltage that is lower than the first power source, the second transistor being configured to be turned on or off to correspond to a voltage applied to a second node that is directly coupled to a gate electrode of the second transistor;

a third transistor coupled between a fourth input terminal and the first node, and having a gate electrode directly coupled to a first input terminal, the third transistor being configured to electrically couple the first node to the fourth input terminal in response to a signal received from the first input terminal;

a fourth transistor coupled between the first power source and the second node, and having a gate electrode directly coupled to the first node;

a first controller coupled to the first input terminal and a second input terminal and configured to supply a sampling signal to a second output terminal;

a second controller electrically coupled to the first input terminal and a third input terminal and configured to control the voltage of the second node; and a first capacitor electrically coupled between the second input terminal and the second node.

16. The organic light emitting display as claimed in claim 15, further comprising a second capacitor coupled between the first node and the first power source.

17. The organic light emitting display as claimed in claim 15, wherein the first input terminal of an $i^{th}$ stage of the stages is configured to receive a first clock signal, wherein the second input terminal of the $i^{th}$ stage is configured to receive a second clock signal, wherein the third input terminal of the $i^{th}$ stage is configured to receive a third clock signal, and wherein the fourth input terminal of the $i^{th}$ stage is configured to receive a start signal or a sampling signal of a previous stage.

18. The organic light emitting display as claimed in claim 17, wherein the first input terminal of an $(i+1)^{th}$ stage of the stages is configured to receive the second clock signal, wherein the second input terminal of the $(i+1)^{th}$ stage is configured to receive the first clock signal, wherein the third input terminal of the $(i+1)^{th}$ stage is configured to receive the third clock signal, and wherein the fourth input terminal of the $(i+1)^{th}$ stage is configured to receive the start signal or the sampling signal of a previous stage.

19. The organic light emitting display as claimed in claim 18, wherein each of the first clock signal and the second clock signal are set in a period of i horizontal periods, and wherein the third clock signal is set in a period of i/2 horizontal periods.

20. The organic light emitting display as claimed in claim 18, wherein the third clock signal is supplied in a horizontal period after the first clock signal or the second clock signal is supplied in the horizontal period.

21. The organic light emitting display as claimed in claim 18, wherein the third clock signal supplied to the $i^{th}$ stage and the $(i+1)^{th}$ stage is supplied via different transmission lines.

22. The organic light emitting display as claimed in claim 15, wherein the first controller comprises:

a fifth transistor coupled between the fourth input terminal and a third node, and having a gate electrode coupled to the first input terminal;

a sixth transistor coupled between a sixth node and the second input terminal, and having a gate electrode coupled to the third node;

a seventh transistor coupled between the sixth node and the first power source, and having a gate electrode coupled to the first output terminal;

a third capacitor coupled between the third node and the sixth node; and a fourth capacitor coupled between the first output terminal and the first power source.

23. The organic light emitting display as claimed in claim 22, wherein the second output terminal is electrically coupled to the sixth node.

24. The organic light emitting display as claimed in claim 15, wherein the second controller comprises:
 an eighth transistor coupled between the first input terminal and a fourth node, and having a gate electrode coupled to the first node;
 a ninth transistor coupled between the fourth node and the second power source, and having a gate electrode coupled to the first input terminal;
 a tenth transistor coupled between the second node and a fifth node, and having a gate electrode coupled to the third input terminal;
 an eleventh transistor coupled between the fifth node and the third input terminal, and having a gate electrode coupled to the fourth node; and
 a fifth capacitor coupled between the fourth node and the fifth node.

25. The organic light emitting display as claimed in claim 15, further comprising:
 a twelfth transistor coupled between the fourth input terminal and the third transistor, the twelfth transistor being configured to be turned on when a first control signal is supplied to a gate electrode of the twelfth transistor; and
 a thirteenth transistor coupled between a fifth input terminal and the first controller, the thirteenth transistor being configured to be turned on when a second control signal is supplied to a gate electrode of the thirteenth transistor,
 wherein the twelfth transistor and the thirteenth transistor are configured to be turned on at different times.

26. The organic light emitting display as claimed in claim 15, further comprising a fourteenth transistor coupled between the first node and the second power source, the fourteenth transistor being configured to be turned on when a reset signal is supplied.

* * * * *